Oct. 27, 1959 J. W. TONER 2,910,583

TIMED PULSE DELAY CIRCUIT

Filed July 23, 1956

INVENTOR.
JAMES W. TONER

BY Paul M Enlow

AGENT 2,910,583

TIMED PULSE DELAY CIRCUIT

James W. Toner, Brooklyn, N.Y., assignor to International Business Machines Corporation, New York, N.Y., a corporation of New York Application July 23, 1956, Serial No. 599,556

14 Claims. (Cl. 250—27)

Figure 2:
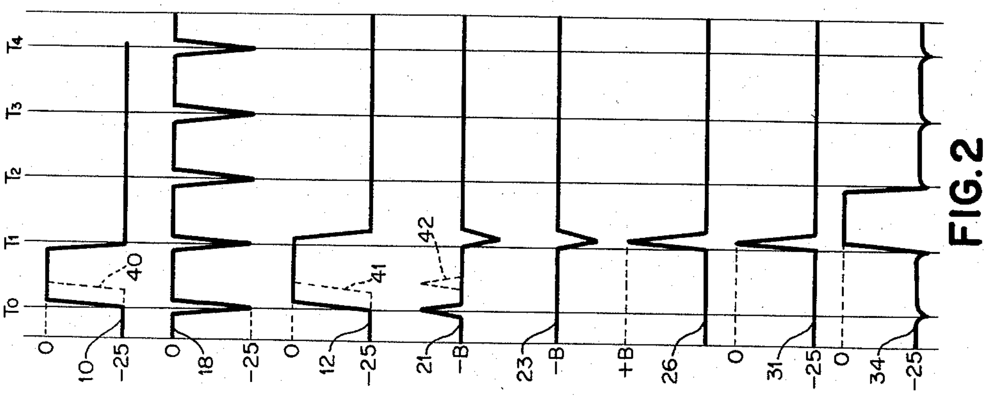

This invention relates to pulse delay circuits and more particularly to a delay circuit of the type that provides an output pulse which is delayed one pulse time interval with respect to the input pulse.

Pulse delay circuit arrangements found in the prior art generally are of the lumped parameter type, the multivibrator type, or include a temporary storage arrangement wherein a plurality of external timing pulses are required in order to establish the leading and trailing edges of the output pulse. Prior pulse delay circuits of the latter variety, such as the circuit disclosed in Reissue Patent 23,699 (originally No. 2,624,839, dated January 6, 1953) by Byron L. Havens, employs two sources of timing signals referred to as synchronizing pulses and clamping pulses. The synchronizing pulse and the clamping pulse are accurately synchronized with each other so that the termination of the synchronizing pulse causes an inductance to be charged. The overshoot or ringing of said inductance falls into the next time interval during which the delayed output signal is generated. The overshoot of the inductance charges a capacitor which is discharged at the end of the time interval by the next clamping pulse. The present invention is an improvement over the above device in that a single source of timing pulses is required to both synchronize the input signal with the timing pulses and also to establish the trailing edge of the delayed output pulse at the end of a time interval. In addition, the present invention eliminates the requirement of an overshoot or ringing potential produced by an inductance to establish the leading edge of the delayed output signal.

Delay circuits of the type disclosed herein, are frequently utilized in computing circuitry, as a storage unit, or where it is desired to delay a pulse until a subsequent time interval. The present invention is particularly useful in electronic computers, for example, where the input pulses are used to represent binary digits.

Accordingly, the principal object of the invention is to provide an electronic circuit capable of generating a timed output pulse in response to each input pulse by utilizing a single source of timing or clock pulses.

Another object is to provide a pulse responsive circuit which can receive a second input pulse while producing an output pulse corresponding to a first input pulse without interaction between the input and output circuits.

A further object is to provide an electronic circuit for producing an output pulse of predetermined characteristics in response to an input pulse whose characteristics have deteriorated.

An additional object is to provide a pulse responsive circuit for reshaping and delaying each input pulse for a predetermined time interval.

A further object is to provide an electronic pulse delay circuit operable by a single source of timing pulses wherein each input pulse is resynchronized by a single timing pulse.

Another object is to provide a delay circuit including storage means for receiving and storing each input pulse, circuitry for retiming each input pulse and for energizing a second storage means, wherein the operation of both of said storage means is synchronized by a single source of timing pulses.

Generally, the present invention includes a capactive circuit for receiving and storing each input pulse. The trailing edge of each input pulse is retimed by a timing pulse. The retimed pulse is differentiated and the positive portion of the differentiated signal is removed. The remaining negative portion of the differentiated signal is inverted and thereafter utilized to charge a storage capacitor. Since the negative portion of the differentiated signal occurred coincidentally with a timing pulse, the storage capacitor is initially charged at this time. The next subsequently occurring timing pulse discharges the storage capacitor.

Thus, a pulse having a time duration equal to the time elapsing between adjacent timing pulses appears across the storage capacitor. The voltage pulse appearing across said capacitor constitutes the output pulse and may be thereafter applied to further circuitry. The output pulse occurs during the time interval following the interval during which the input pulse was applied to the circuit. The input and output circuits of the invention are isolated from each other so that the application of an input pulse to the delay circuit does not interfere with a pulse appearing simultaneously at the output thereof as a result of a preceding input pulse.

Other objects of the invention will be pointed out in the following description and claims and illustrated in the accompanying drawings, which disclose, by way of example, the principle of the invention and the best mode, which has been contemplated, of applying that principle.

Figure 1:
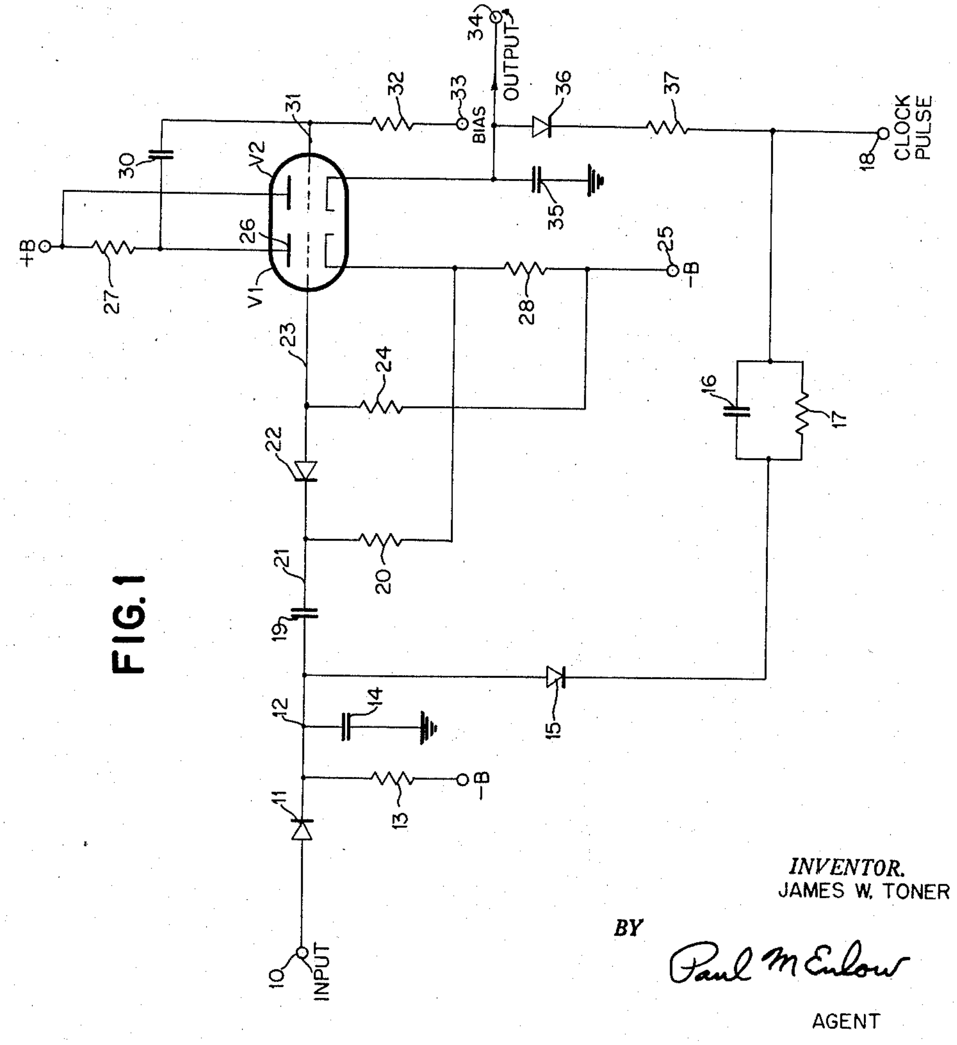

In the drawing:

Fig. 1 is a circuit diagram of a pulse delay circuit embodying the present invention; and Fig. 2 illustrates the idealized voltage waveforms which occur in various portions of the circuit of Fig. 1.

Referring more particularly to Fig. 1, there is shown an input terminal 10 to which each input pulse is applied. An input pulse is illustrated in Fig. 2, waveform 10, as occurring during the time interval $T_0$–$T_1$. The input terminal is connected to the anode of diode 11, the cathode of which is connected to juncture 12 and through resistor 13 to a source of negative potential. The cathode of diode 11 is also connected through capacitor 14 to ground. Juncture 12 is also connected through diode 15 and further through capacitor 16 and resistor 17, in parallel, to terminal 18. A source of timing or clock pulses is applied to terminal 18. The timing pulses applied to terminal 18 are illustrated in waveform 18 of Fig. 2. Diode 15 is arranged to pass the negative direction timing pulses, but prohibits the passage of a positive signal. The elements 16 and 17 delay each timing pulse slightly for reasons set forth hereinafter.

There is provided a differentiating circuit comprising capacitor 19 and resistor 20. Capacitor 19 is connected between junctures 12 and 21, and resistor 20 is connected between juncture 21 and the cathode of inverter V1. Juncture 21 is connected through diode 22 to the control grid 23 of V1. This control grid is further connected through grid resistor 24 to terminal 25. A negative source of potential is applied to terminal 25. Diode 22 is arranged in the circuit so as to pass the negative portion of the differentiated signal appearing at juncture 21, but to prohibit the passage of the positive portion of said signal.

Triode V1 serves as an inverter, the anode 26 of which is connected through plate load resistance 27 to a B+ terminal and the cathode is connected through cathode resistance 28 to the negative bias potential applied to terminal 25. The anode 26 of V1 is connected through coupling capacitor 30 to the control grid 31 of triode V2. Triode V2 is a cathode follower. The grid of tube V2 is also connected through grid resistor 32 to terminal 33 which is connected to a negative source of bias potential. The anode of tube V2 is connected to the B+ terminal and the cathode thereof is connected to the output terminal 34. There is provided a storage capacitor 35 which is connected between output terminal 34 and ground. Terminal 34 is also connected through diode 36 and decoupling resistor 37, in series, to terminal 18. Resistor 37 provides decoupling between the timing pulse source terminal 18 and the output circuit of the delay circuit. Diode 36 is connected so as to permit the passage of the negative direction timing pulses, but prohibits the passage therethrough of positive direction signals.

The idealized waveforms of the circuit of Fig. 1 are illustrated in Fig. 2. For ease of reference, the reference character associated with a particular point in the circuit of Fig. 1 is shown adjacent the corresponding waveform of Fig. 2.

For purposes of explanation, assume that the input pulse illustrated in curve 10 of Fig. 2 is applied to input terminal 10 of Fig. 1. This pulse is passed through diode 11 and causes capacitor 14 to be charged to the maximum level of the input pulse. Since the input pulse rises from approximately —25 volts to 0 volts, for example, the potential at juncture 12 rises to approximately 0 volts (waveform 12 of Fig. 2), due to the low forward resistance of diode 11. The lower end of resistor 13 is connected to a negative bias potential which serves to prevent the potential at juncture 12 from rising above the level of the input terminal when there is no pulse present thereat.

The dashed line 40 illustrated in waveform 10 of Fig. 2, illustrates the occurrence of the leading edge of the input pulse at a time later than $T_0$. The leading edge of the input pulse may be delayed due to previous circuitry through which the pulse has passed.

The voltage waveform of the clock pulses which are applied to terminal 18 is illustrated in curve 18 of Fig. 2. Under ideal conditions, the period of timing pulses is equal to the time duration of the input pulse. It will be shown hereinafter, that the invention does not require that the leading and trailing edges of each input pulse coincide exactly with timing pulses.

The timing pulse occurring at time $T_1$ of Fig. 2 (immediately after capacitor 14 of Fig. 1 has been charged by the leading edge of the input signal) causes the capacitor to discharge thereby synchronizing the trailing edge of the pulse at juncture 12 with a timing pulse. The signal at juncture 12 is then applied to the differentiating circuit composed of capacitor 19 and resistor 20. The differentiating circuit produces the waveform illustrated in curve 21 of Fig. 2 at juncture 21. Diode 22 and resistor 24 comprise a clipping circuit which removes the positive portion of waveform 21 of Fig. 2. Diode 22 is biased so that its cathode is slightly more positive than its anode, since resistor 20 is returned to a more positive potential than is resistor 24. The difference in this potential is equal to the voltage drop across resistor 28. Thus diode 22 removes the positive voltage pulses of waveform 21 so that only the negative pulses thereof are applied to the control grid of tube V1.

Tube V1 is normally conducting so that the negative pulse of waveform 23 of Fig. 2 causes a decrease in the plate current of tube V1. The anode voltage of V1 thereafter rises sharply so as to produce waveform 26 (Fig. 2) across resistor 27. The signal appearing at the anode of V1, is coupled through capacitor 30 to the control grid 31 of tube V2. Since this signal is a positive direction signal, it causes the plate current of tube V2 to increase so that the cathode voltage thereof increases from —25 volts to approximately 0 volts. The increased cathode voltage of tube V2 causes capacitor 35 to be charged to approximately 0 volts. This capacitor will remain at the 0-volt level until diode 36 conducts and discharges the capacitor. The timing pulse applied to terminal 18 at time $T_1$ causes capacitor 35 to be discharged thereby establishing the trailing edge of the output pulse appearing on terminal 34 and illustrated as waveform 34 of Fig. 2.

The purpose of the resistor 17 and capacitor 16 combination of Fig. 1 is to provide a slight time delay in the timing pulse applied to juncture 12. This slight delay ensures that the trailing edge of the retimed pulse at juncture 12 falls into the next time interval. If this delay were not provided, the output of the differentiating circuit (waveform 23), might occur at the same time that capacitor 35 is being discharged by a clock or timing pulse. The slight delay provided by 16 and 17 ensures that the leading edge of the output signal, appearing at terminal 34, will rise to its maximum value during the next time interval.

It is to be noted that the input pulse applied to input terminal 10 need not necessarily be equal in width to the time duration of a single time interval. For example, reactive circuitry through which an input pulse has previously passed, may delay in time the leading edge as illustrated by the dashed line 40 of waveform 10 of Fig. 2. Where the leading edge of the input pulse is delayed, the leading edge of the pulse appearing at juncture 12 will be delayed as indicated by the dashed line 41 associated with waveform 12 of Fig. 2. Similarly, the positive direction pulse of waveform 21 is delayed in accordance with the delay of the leading edge of the input pulse as illustrated by the dashed line 42 of Fig. 2. The fact that the leading edge of an input pulse is delayed does not affect the operation of the delay circuit of Fig. 1 so long as sufficient time is provided for the first storage capacitor 14 to be charged.

Summarizing briefly, each input pulse energizes or charges the first storage means 14 of Fig. 1. The first storage means 14 is then discharged or de-energized by a timing pulse appearing on terminal 18, thereby retiming the trailing edge of the input pulse. The de-energization of the first storage means creates a signal wihch is differentiated and the differentiated signal is applied to the control grid of tube V1. The differentiated signal is inverted by tube V1 and applied via cathode follower V2 to the second storage means 35. Thus the differentiated signal causes the second storage means to be energized coincidentally with the occurrence of a timing pulse. The next subsequently occurring timing pulse de-energizes the second storage means thereby defining the trailing edge of the output pulse. It is apparent therefore, that the output pulse appearing on terminal 34 is synchronized with the timing pulses applied to terminal 18.

The foregoing description of the circuit of Fig. 1 shows that an input pulse applied to the input terminal during any given time interval, causes an output pulse to be produced in the succeeding time interval. It is also apparent that an output pulse may be generated simultaneously during the time interval that an input pulse is received without destroying the fidelity of the waveform produced at the output terminal, that is, that the input and output circuits are isolated from each other.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A pulse delay circuit for receiving an input pulse and producing a delayed output pulse comprising, first storage means energized by each input pulse, a single source of serially occurring timing pulses, second storage means, means for de-energizing said first storage means to a predetermined reference level in response to one of said timing pulses, means responsive to the deenergization of said first storage means for energizing said second storage means, and means for thereafter de-energizing said second storage means to a predetermined reference level in response to another one of said timing pulses.

2. A pulse delay circuit for delaying an input pulse one time interval comprising, a source of uniformly spaced timing pulses, first means adapted to be energized by an input pulse to a first predetermined condition, means for de-energizing said first means thereafter to a second predetermined condition in response to a pulse from said source to provide a retimed signal, storage means, means responsive to said retimed signal for energizing said storage means, and means coupling said source to said storage means for de-energizing the latter at the termination of each time interval after it has been energized.

3. An electronic delay circuit for receiving an input pulse and providing an output pulse a predetermined time thereafter comprising, a first storage means having first and second conditions and responsive to each input pulse to establish said first condition thereat, a second storage means, a single source of pulses defining uniform time intervals, circuit means coupled to said first storage means for establishing said second condition thereat in response to one of said timing pulses to establish a predetermined signal, means responsive to said predetermined signal and coupled to said second storage means for establishing a first predetermined condition at the latter, and further circuit means coupling said source to said second storage means for establishing a second predetermined condition at said second storage means whereby a pulse is produced at said second storage means one time interval after the input pulse was applied to said first storage means.

4. A pulse delay circuit for delaying an input pulse one time interval comprising, a single source of uniformly occurring timing pulses, first capacitive storage means for storing a charge in response to an input pulse, means coupled to said source to remove all of said stored charge from said first capacitive storage means to provide a retimed signal, second capacitive storage means, means coupling said retimed signal to said second capacitive storage means to charge the latter, and means coupling said source to said second capacitive storage means for discharging the latter at the termination of each time interval.

5. A pulse delay circuit comprising, reactive means for receiving and storing an input pulse, a single source of uniformly occurring timing pulses, circuit means coupling said source to said reactive means to discharge the latter for providing a retimed pulse, a capacitive storage means, means responsive to said retimed pulse to charge said capacitive storage means coincidentally with a predetermined portion of said retimed pulse, and further means coupling said source to said capacitive storage means for discharging said capacitive storage means coincidentally with one of said timing pulses.

6. An electronic circuit for receiving and delaying an input pulse comprising, first energizable means for receiving and storing an input pulse, a source of uniformly occurring timing pulses, circuit means coupling said source to said first means for deenergizing the latter to provide a retimed pulse, differentiating circuit means responsive to said retimed pulse to provide a differentiated signal, second storage means, means responsive to said differentiated signal to energize said second storage means coincidentally with said retimed pulse, and means coupling said source to said second storage means to de-energize the latter coincidentally with one of said timing pulses.

7. An electronic circuit for receiving an input pulse and providing a delayed output pulse comprising the combination of, first means for receiving an input pulse, second means for receiving a series of uniformly spaced timing pulses, third means coupled to said first and second means to provide a retimed pulse by retiming the trailing edge of each input pulse in synchronism with one of said timing pulses, fourth means responsive to said retimed pulse for providing a differentiated signal having positive and negative portions, fifth means coupled to said fourth means for removing the positive portions of said differentiated signal and for inverting the negative portions of said signal, a capacitive storage means, means coupling the inverted signal to said capacitive storage means for establishing a predetermined charge on the latter, and means for establishing a second predetermined charge on said capacitor coincidentally with the next subsequent timing pulse.

8. An electronic delay circuit for receiving an input pulse and providing an output pulse one time interval later comprising, first capacitive storage means for receiving and storing each input pulse, a single source of pulses defining uniform time intervals, circuit means coupling said source to said first capacitive storage means for discharging the latter coincidentally with each timing pulse, differentiating circuit means coupled to said first capacitive storage means for producing a differentiated signal, an electronic inverting tube having an anode, cathode and control grid, a diode coupling said control grid to said differentiating circuit and connected to permit the passage of negative direction signals to said control grid, a second capacitive storage means, a cathode follower tube coupling the anode of said inverting tube to said second capacitive storage means for charging the latter coincidentally with the occurrence of said differentiated signal, and diode means coupling said source to said second capacitive storage means for discharging the latter by one of said pulses at the termination of the time interval occurring immediately after the time interval during which the input pulse occurred.

9. An electronic delay circuit for receiving an input pulse during one time interval and producing an output pulse in response thereto during the next time interval comprising, first storage means adapted to be energized by each input pulse, second storage means for producing an output pulse, a single source of uniformly spaced timing pulses means coupling said source to said first storage means to de-energize the latter at a predetermined time after each input pulse, means coupling said first storage means to said second storage means for energizing said second storage means when said first storage means is de-energized and means coupling said source to said second storage means to de-energize the latter one time interval after the de-energizing of said first storage means, whereby a synchronized output pulse is produced at said second storage means one time interval after the receipt of an input pulse.

10. An electronic delay circuit for receiving an input pulse during one time interval and producing an output pulse in response thereto during the next time interval comprising, first storage means for receiving and storing each input pulse, a source of timing pulses, pulse delay means coupling said source to said first storage means for de-energizing the latter after previously being energized by an input pulse, second storage means for producing an output pulse, circuit means coupling said first storage means to said second storage means for energizing the latter in response to the de-energization of the former, and means coupling said source to said second storage means for de-energizing the latter at the termination of the time interval following the interval during which the input pulse was applied to said first storage means.

11. A device for receiving an input pulse during a first time interval and providing a delayed output pulse during the next interval comprising, first means responsive to each input pulse to provide a retimed pulse, second means coupled to said first means and responsive to said retimed pulse to provide a differentiated signal, third means coupled to said second means and responsive to said differentiated signal to provide an output pulse, and timing means coupled to said first and third means for synchronizing the operation of said first and third means, whereby said third means produces an output pulse during the time interval following the receipt of an input pulse.

12. An electronic delay circuit for receiving an input pulse during a first time interval and producing a delayed output pulse during the next time interval and having input and output terminals comprising: a diode and capacitor connected in series with said input terminal for receiving and storing each input pulse; a source of equally spaced timing pulses; a resistive-capacitive delay network coupling said source to the juncture of said diode and said capacitor whereby said capacitor is discharged at the commencement of each time interval to provide a retimed pulse at said juncture; a differentiating circuit having input and output terminals, the input of which is connected to said juncture, for producing a differentiated signal in response to said retimed pulse; a normally conductive inverting tube having at least a grid and an anode; a diode coupling the output of said differentiating circuit to said grid and biased to transmit negative pulses only, whereby said differentiated signal momentarily renders said tube non-conductive thereby producing a positive pulse at said anode; a cathode follower tube having at least a cathode and a control grid; means coupling said anode to the grid of said cathode follower, whereby the positive pulse at said anode momentarily renders said cathode follower fully conductive; a storage capacitor connected to said cathode for receiving a first charge when said cathode follower is rendered fully conductive; a diode and a resistor in series between said storage capacitor and said source, whereby each timing pulse subjects said storage capacitor to a second charge at the termination of each time interval to produce an output pulse; and a connection between said storage capacitor and said output terminal, whereby an output pulse appears at said output terminals during the time interval following the interval during which an input pulse is applied to said input terminal.

13. A time pulse delay circuit adapted to receive an input signal and to produce an output signal during a subsequent time interval comprising, a first storage means for receiving and storing each input signal, a single source of timing pulses, delay means coupling each timing pulse to said first storage means for generating an electrical signal in response to the storage of an input signal, a differentiating circuit adapted to receive said electrical signal and to produce in response thereto a differentiated signal, an electron discharge device coupled to said differentiating circuit for inverting said differentiated signal, a second electron discharge device having at least two elements, means coupling the inverted-differentiated signal to the first one of said elements, a storage capacitor coupled to the second one of said elements whereby said differentiated signal is effective to charge said storage capacitor to a first potential, an output circuit coupled to said storage capacitor, and circuit means coupling said source to said storage capacitor for charging the latter to a second potential, whereby an output signal appears at said output terminal during a time interval subsequent to the receipt of an input pulse.

14. In an electronic delay circuit for receiving an input pulse and producing an output pulse a predetermined time thereafter, a first storage capacitor for storing each input pulse, a source of timing pulses, means discharging said first storage capacitor in response to one of said timing pulses to produce a retimed signal, a first grid controlled tube connected to be operable to produce an output in response to each said retimed signal, a second grid controlled tube operable as a cathode follower and having an output terminal connected to the cathode thereof and a second capacitor coupling the cathode thereof to ground, and means coupling the control grid of said second tube to the output of said first tube, whereby said second capacitor manifests an output pulse in response to the operation of said first grid controlled tube.

References Cited in the file of this patent

UNITED STATES PATENTS

| | | |
|---|---|---|
| 2,467,486 | Krumhansl et al. | Apr. 19, 1949 |
| 2,500,536 | Goldberg | Mar. 14, 1950 |
| 2,563,816 | Butman | Aug. 14, 1951 |
| 2,609,493 | Wilmotte | Sept. 2, 1952 |
| 2,802,105 | Odden | Aug. 6, 1957 |